(12) United States Patent
Jeunink et al.

(10) Patent No.: US 9,116,423 B2
(45) Date of Patent: Aug. 25, 2015

(54) IMPRINT LITHOGRAPHY APPARATUS

(75) Inventors: Andre Bernardus Jeunink, Bergeik (NL); Vadim Yevgenyevich Banine, Deurne (NL); Hans Butler, Best (NL); Engelbertus Antonius Fransiscus Van Der Pasch, Oirschot (NL); Johannes Petrus Martinus Bernardus Vermeulen, Helmond (NL); Yvonne Wendela Kruijt-Stegeman, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 959 days.

(21) Appl. No.: 12/821,806

(22) Filed: Jun. 23, 2010

(65) Prior Publication Data

US 2011/0008483 A1 Jan. 13, 2011

Related U.S. Application Data

(60) Provisional application No. 61/213,700, filed on Jul. 6, 2009.

(51) Int. Cl.
*B29C 59/02* (2006.01)
*G03F 7/00* (2006.01)
*B82Y 10/00* (2011.01)
(Continued)

(52) U.S. Cl.
CPC .............. *G03F 7/0002* (2013.01); *B82Y 10/00* (2013.01); *B82Y 40/00* (2013.01); *G03F 9/00* (2013.01)

(58) Field of Classification Search
None
See application file for complete search history.

(56) References Cited

U.S. PATENT DOCUMENTS 4,731,155 A 3/1988 Napoli et al.
5,772,905 A 6/1998 Chou
(Continued)

FOREIGN PATENT DOCUMENTS

JP 2006-203183 8/2006
JP 2006-332677 12/2006
(Continued)

OTHER PUBLICATIONS

J. Haisma "Mold-Assisted nanolithography: A process for reliable pattern replication", J. Vac. Sci. Technol. B14(6) Nov./Dec. 1996.
(Continued)

*Primary Examiner* — Ryan Ochylski
(74) *Attorney, Agent, or Firm* — Pillsbury Winthrop Shaw Pittman LLP

(57) ABSTRACT

An imprint lithography apparatus is disclosed that includes a structure located away from a substrate holder and extending across the substrate holder, and such that an imprint template arrangement is, in use, located between the structure and the substrate holder, wherein the structure has one or more arrays of lines or one or more encoders, and the substrate or substrate holder and the imprint template have a corresponding one or more encoders that face towards one or more of the one or more arrays of lines or one or more arrays of lines that face towards one or more of the one or more encoders, and the configuration determination arrangement is configured to determine a relative configuration between the substrate or substrate holder and the structure, and/or a relative configuration between the imprint template arrangement and the structure, and/or a relative configuration between the imprint template arrangement and the substrate or substrate holder.

20 Claims, 6 Drawing Sheets

(51) Int. Cl.
  *B82Y 40/00*   (2011.01)
  *G03F 9/00*   (2006.01)

(56) References Cited

U.S. PATENT DOCUMENTS

| | | |
|---|---|---|
| 6,334,960 B1 | 1/2002 | Willson et al. |
| 6,900,881 B2 | 5/2005 | Sreenivasan et al. |
| 7,070,405 B2 | 7/2006 | Sreenivasan et al. |
| 7,253,875 B1 | 8/2007 | Luttikhuis et al. |
| 7,483,120 B2 | 1/2009 | Luttikhuis et al. |
| 7,676,088 B2 | 3/2010 | Simon |
| 7,999,912 B2 | 8/2011 | Van Der Pasch et al. |
| 2004/0021866 A1* | 2/2004 | Watts et al. ............ 356/401 |
| 2004/0124566 A1 | 7/2004 | Sreenivasan et al. |
| 2005/0274693 A1 | 12/2005 | Heidari et al. |
| 2006/0267231 A1 | 11/2006 | Van Santen et al. |

FOREIGN PATENT DOCUMENTS

| | | |
|---|---|---|
| JP | 2007-251156 | 9/2007 |
| JP | 2007-318119 | 12/2007 |
| JP | 2009-027141 | 2/2009 |
| WO | 02/067055 | 8/2002 |

OTHER PUBLICATIONS

Japanese Office Action mailed Mar. 16, 2012 in corresponding Japanese Patent Application No. 2010-147032.

* cited by examiner

IMPRINT LITHOGRAPHY APPARATUS

This application claims priority and benefit under 35 U.S.C. §119(e) to U.S. Provisional Patent Application No. 61/213,700, entitled "Imprint Lithography Apparatus", filed on Jul. 6, 2009. The content of that application is incorporated herein in its entirety by reference.

FIELD

The present invention relates to an imprint lithography apparatus.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features that has gained increasing interest is so-called imprint lithography, which generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

Imprint lithography involves the patterning of an imprintable medium on a surface of a substrate to be patterned. The patterning may involve contacting a patterned surface of an imprint template with a layer of imprintable medium such that the imprintable medium flows into recesses in the patterned surface and is pushed aside by protrusions on the patterned surface. The recesses define pattern features of the patterned surface of the imprint template. Typically, the imprintable medium is flowable as the patterned surface contacts the imprintable medium. Following patterning of the imprintable medium, the imprintable medium is suitably brought into a non-flowable or frozen state and the patterned surface of the imprint template and the patterned imprintable medium are separated. The substrate and patterned imprintable medium are then typically processed further in order to pattern or further pattern the substrate. The imprintable medium is typically formed from imprintable medium droplets on the surface of a substrate to be patterned.

SUMMARY

In order to accurately and consistently apply a pattern in the imprintable medium, it is desirable to be able to accurately position an imprint template relative to a substrate (or, for example, a substrate holder that holds that substrate), and/or vice versa. Furthermore, in order to accurately and consistently apply a pattern in the imprintable medium it is desirable to be able to monitor, determine and take into account any relative rotation between the imprint template and the substrate, or expansion of the imprint template (due to the imprint template being heated, or the like).

The imprint template is moveable by moving an imprint template holder that holds the imprint template. Similarly, the substrate may be moveable by moving a substrate holder that holds the substrate. The relative positioning between the substrate or substrate holder and the imprint template or imprint template holder may be undertaken using, at least in part, an interferometric arrangement. For instance, one or more interferometers may be used to determine the distance from a fixed frame to the substrate holder, and another interferometer may be used to determine the distance from the same fixed frame to the imprint template holder. If such an arrangement is implemented in more than one dimension, it may be possible to determine the position of the imprint template holder relative to the frame, and also of the substrate holder relative to the frame, and therefore the relative position between the substrate holder and the imprint template holder.

The use of an interferometric arrangement may be satisfactory when only a single imprint template holder or a single imprint template is used to imprint patterns into an imprintable medium (i.e. imprint pattern features onto a substrate). However, when more than one imprint template holder is used, or more than one imprint template is used, one or more of the imprint templates or imprint template holders may block or obstruct one or more radiation beams used by the interferometer arrangement. This blocking or obstructing can result in it being difficult or impossible to obtain positional or rotational information relating to one or more of the imprint template holders or imprint templates. Furthermore, such blocking or obstructing may make it difficult or impossible to obtain information regarding any expansion or contraction of the one or more imprint template holders or imprint templates. Information regarding any expansion or contraction of an imprint template in particular is of significance in imprint lithography. This is because any expansion or contraction of an imprint template will result in a related expansion or contraction of a patterned surface provided on that imprint template. Such expansion or contraction of the patterned surface can lead to deformities in patterns applied to a substrate using that contracted or expanded imprint template. Such deformity can lead to difficulties, for example, in meeting overlay requirements. Further, interferometer arrangements can be quite cost prohibitive.

It is desirable, for example, to provide an imprint lithography apparatus that obviates or mitigates at least one problem, whether identified herein or elsewhere, or which provides an alternative to an existing imprint lithography apparatus.

According to an aspect, there is provided an imprint lithography apparatus, comprising: an imprint template arrangement for use in imprinting a pattern into imprintable medium; a substrate holder configured to hold a substrate provided with imprintable medium to, in use, be patterned by the imprint template arrangement; a structure located away from the substrate holder and extending across the substrate holder, and such that the imprint template arrangement is, in use, located between the structure and the substrate holder, wherein the structure has a first part of a configuration determination arrangement and the substrate or substrate holder and the imprint template having a second part of the configuration determination arrangement, the first part of the configuration determination arrangement or the second part of the configuration determination arrangement comprising one or more arrays of lines, and the other of the first part of the configuration determination arrangement and second part of the configuration determination arrangement comprising one or more encoders that faces towards one or more of the one or more arrays of lines, and the configuration determination arrangement is configured to determine at least one selected from: a relative configuration between the substrate or substrate holder and the structure, or a relative configuration between the imprint template arrangement and the structure, or a relative configuration between the imprint template arrangement and the substrate or substrate holder.

A single array of lines may be provided, the single array of lines extending across substantially half or more of the structure.

A plurality of arrays of lines may be provided, each array of the plurality being located at a different position on the structure.

The structure may extend across the substrate in a continuous manner, such that the structure is free of apertures.

According to an aspect, there is provided an imprint lithography apparatus, comprising: an imprint template arrangement for use in imprinting a pattern into imprintable medium; a substrate holder configured to hold a substrate provided with imprintable medium to, in use, be patterned by the imprint template arrangement, wherein the imprint template arrangement is fixed in position, and the substrate holder is moveable relative to the imprint template arrangement, the imprint template arrangement has a first part of a configuration determination arrangement, and the substrate or substrate holder has a second part of the configuration determination arrangement, the first part of the configuration determination arrangement or the second part of the configuration determination arrangement comprising one or more arrays of lines, and the other of the first part of the configuration determination arrangement and second part of the configuration determination arrangement comprising one or more encoders that face towards one or more of the one or more arrays of lines, and the configuration determination arrangement is configured to determine a relative configuration between the substrate or substrate holder and the imprint template arrangement.

According to an aspect, there is provided an imprint lithography apparatus, comprising: an imprint template arrangement for use in imprinting a pattern into imprintable medium; a substrate holder configured to hold a substrate provided with imprintable medium to, in use, be patterned by the imprint template arrangement, wherein the substrate holder is fixed in position, and the imprint template arrangement is moveable relative to the substrate holder, the imprint template arrangement has a first part of a configuration determination arrangement, and the substrate or substrate holder has a second part of the configuration determination arrangement, the first part of the configuration determination arrangement or the second part of the configuration determination arrangement comprising one or more arrays of lines, and the other of the first part of the configuration determination arrangement and second part of the configuration determination arrangement comprising one or more encoders that face towards one or more of the one or more arrays of lines, and the configuration determination arrangement is configured to determine a relative configuration between the substrate or substrate holder and the imprint template arrangement.

According to an aspect, there is provided an imprint lithography apparatus, comprising: an imprint template arrangement for use in imprinting a pattern into imprintable medium; a substrate holder configured to hold a substrate provided with imprintable medium to, in use, be patterned by the imprint template arrangement, wherein the imprint template arrangement and substrate holder are moveable relative to one another, the imprint template arrangement having a first part of a configuration determination arrangement, and the substrate or substrate holder having a second part of the configuration determination arrangement, the first part of the configuration determination arrangement or the second part of the configuration determination arrangement comprising one or more arrays of lines, and the other of the first part of the configuration determination arrangement and second part of the configuration determination arrangement comprising one or more encoders that face towards one or more of the one or more arrays of lines, and the configuration determination arrangement is configured to determine a relative configuration between the substrate or substrate holder and the imprint template arrangement.

In accordance with any of the aspects, the first part of the configuration determination arrangement comprises one or more arrays of lines, and the second part of the configuration determination arrangement comprises one or more encoders that face towards one or more of the one or more arrays of lines.

In accordance with any of the aspects, the second part of the configuration determination arrangement comprises one or more arrays of lines, and the first part of the configuration determination arrangement comprises one or more encoders that face towards one or more of the one or more arrays of lines.

In accordance with any of the aspects, the number and/or arrangement of array of lines, and the number and/or arrangement of encoders, may together be sufficient to be able to determine the relative configuration in three or four degrees of freedom, the three or four degrees of freedom being three or four three or four selected from: translation in a first direction; or translation in a second direction; or rotation; or expansion or contraction (which is equivalent to negative expansion). The one or more arrays of lines may comprise lines extending in a first direction and lines extending in a second direction, and the one or more encoders may comprise: at least four encoders, at least two of the at least four encoders each configured to determine movement in a direction relative to the first direction, and at least two others of the at least four encoders each configured to determine movement in a direction relative to the second direction, or at least three or four encoders, at least one of the three or four encoders configured to determine movement in a direction relative to the first direction, and at least one of the other encoders configured to determine movement in a direction relative to the second direction, or at least two encoders, each of at least two encoders configured to determine movement in a direction relative to the first direction and a direction relative to the second direction. The first direction may be substantially perpendicular to the second direction.

In accordance with any of the aspects, a plurality of imprint template arrangements may be provided, each imprint template arrangement having a first part of the configuration determination arrangement or a second part of the configuration determination arrangement.

In accordance with any of the aspects, the relative configuration may be one or more selected from: a relative translational position, or a relative rotational position, or a relative degree of expansion (i.e. a relative position or orientation).

BRIEF DESCRIPTION OF THE DRAWINGS

Specific embodiments of the invention will be described with reference to the accompanying Figures, in which.

DETAILED DESCRIPTION

Figure 1A:
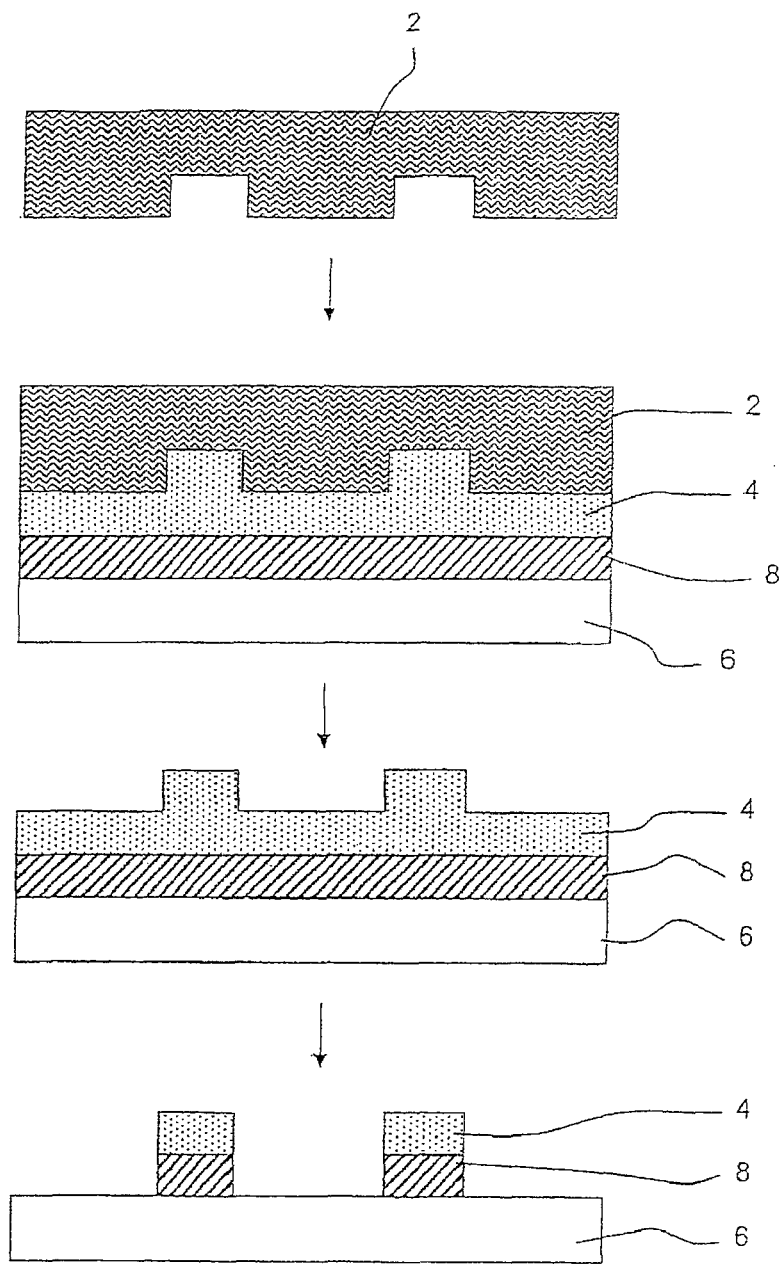
FIGS. 1a and 1b schematically depict examples of, respectively, hot imprint, and UV imprint lithography.
Figure 1B:
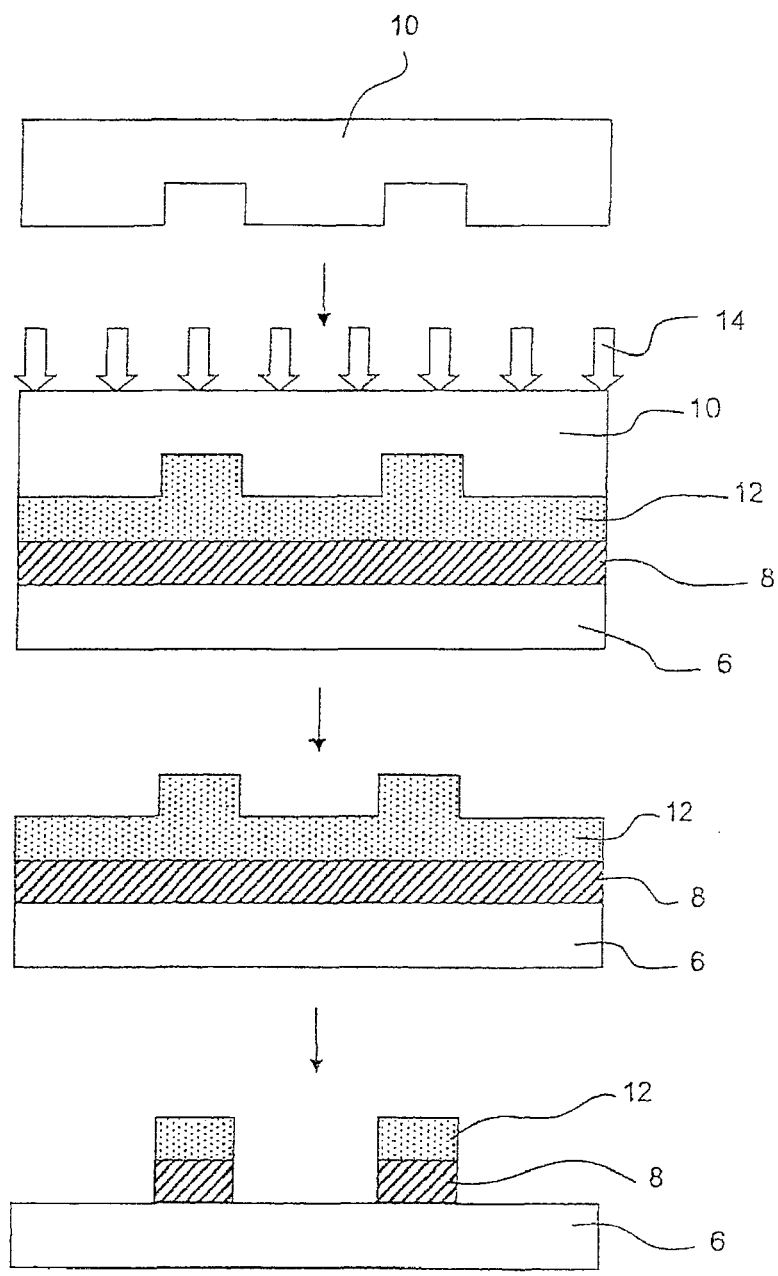

Examples of two approaches to imprint lithography are schematically depicted in FIGS. 1a to 1b.

FIG. 1a shows an example of so-called hot imprint lithography (or hot embossing). In a typical hot imprint process, a template 2 is imprinted into a thermosetting or a thermoplastic imprintable medium 4, which has been cast on the surface of a substrate 6. The imprintable medium 4 may be, for example, resin. The resin may be, for instance, spin coated and baked onto the substrate surface or, as in the example illustrated, onto a planarization and transfer layer 8 of the substrate 6. When a thermosetting polymer resin is used, the resin is heated to a temperature such that, upon contact with the template, the resin is sufficiently flowable to flow, into the pattern features defined on the template. The temperature of the resin is then increased to thermally cure (crosslink) the resin so that it solidifies and irreversibly adopts the desired pattern. The template 2 may then be removed and the patterned resin cooled. In hot imprint lithography employing a layer of thermoplastic polymer resin, the thermoplastic resin is heated so that it is in a freely flowable state immediately prior to imprinting with the template 2. It may be necessary to heat a thermoplastic resin to a temperature considerably above the glass transition temperature of the resin. The template contacts the flowable resin, which is then cooled to below its glass transition temperature with the template 2 in place to harden the pattern. Thereafter, the template 2 is removed. The pattern will consist of the features in relief from a residual layer of the imprintable medium which may then be removed by an appropriate etch process to leave only the pattern features. Examples of thermoplastic polymer resins used in hot imprint lithography processes are poly(methyl methacrylate), polystyrene, poly(benzyl methacrylate) or poly(cyclohexyl methacrylate). For more information on hot imprint, see e.g. U.S. Pat. No. 4,731,155 and U.S. Pat. No. 5,772,905.

FIG. 1b shows an example of UV imprint lithography, which involves the use of a transparent or translucent template which is transmissive to UV and a UV-curable liquid as imprintable medium (the term "UV" is used here for convenience but should be interpreted as including any suitable actinic radiation for curing the imprintable medium). A UV curable liquid is often less viscous than a thermosetting or thermoplastic resin used in hot imprint lithography and consequently may move much faster to fill template pattern features. A quartz template 10 is applied to a UV-curable imprintable medium 12 in a similar manner to the process of FIG. 1a. However, instead of using heat or temperature cycling as in hot imprint, the pattern is frozen by curing the imprintable medium with UV radiation 14 that is applied through the quartz template onto the imprintable medium. After removal of the template, the pattern will consist of the features in relief from a residual layer of the imprintable medium which may then be removed by an appropriate etch process to leave only the pattern features. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are also possible. See, e.g., U.S. Patent Application Publication No. 2005-0274693, which mentions a combination of heating and UV curing an imprintable medium.

Figure 2:
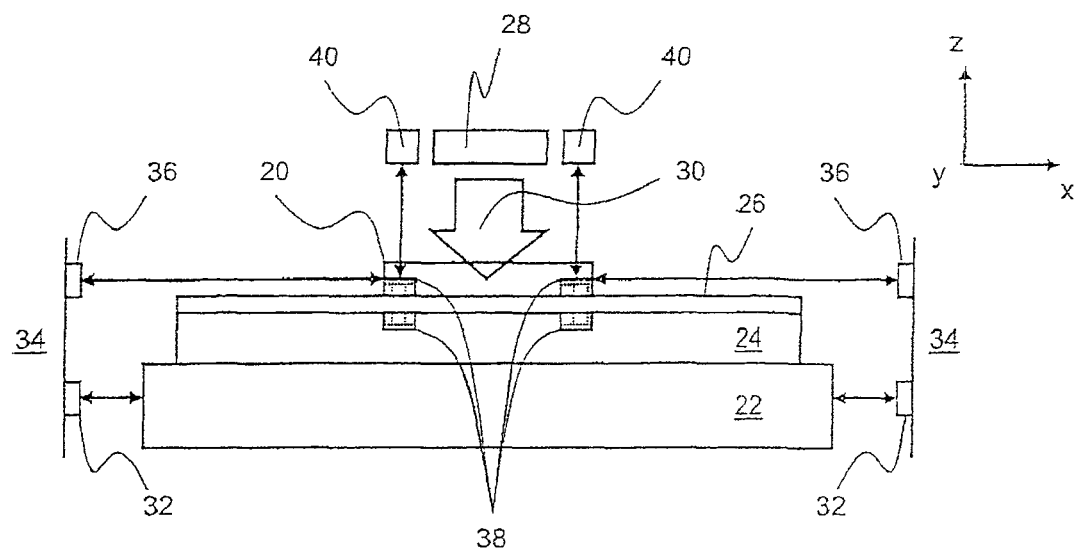
FIG. 2 schematically depicts an embodiment of an imprint apparatus.

FIG. 2 schematically depicts an embodiment of an imprint apparatus. The apparatus comprises, in use, an imprint template arrangement 20. A substrate holder 22 is provided. The substrate holder 22 is provided to hold (i.e. support) a substrate 24. The substrate 24 is provided with a layer of imprintable medium 26. The imprint template arrangement 20 is moveable to be imprinted into the imprintable medium 26 and to thus form pattern features in the imprintable medium 26. In addition or alternatively, the substrate holder 22 is moveable to cause the imprintable medium 26 to contact the imprint template arrangement 20 and to thus form pattern features in the imprintable medium 26. In another embodiment, imprintable medium may only be located at locations on the substrate that are in-between the substrate and the imprint template arrangement or imprint template arrangements (i.e. the imprintable medium may not extend across the entire substrate).

A radiation source 28 is provided. The radiation source 28 provides radiation 30 for freezing (i.e. fixing) a pattern imprinted into the imprintable medium 26 by the imprint template arrangement 20.

In order to be able to accurately and consistently apply patterns to the substrate 24, it is desirable to be able to accurately determine the position of the substrate and imprint template arrangement, as well as any rotation or expansion of the substrate or imprint template arrangement. It is also desirable to be able to accurately align the imprint template arrangement with a part of the substrate onto or into which a pattern is to be imprinted, and/or vice versa.

Referring back to FIG. 2, one or more interferometers 32 may be attached to a frame or other support structure that extends along one side, or around the substrate holder 22. The interferometer 32 may be used to determine the position, or change in position of the substrate holder 22 and therefore the substrate 24 held by the substrate holder 22. If more than one interferometer 32 is used, it may be possible to determine changes in position of the substrate holder 22 in more than one dimension, and to be able to determine expansion or rotation of the substrate holder 22 and (possibly) the substrate 24. In a similar manner, one or more further interferometers 36 may be attached to the support structure 34. The further interferometer 36 may be directed towards the imprint template arrangement 20 and may be used to detect changes in position of the imprint template arrangement 20, and rotation or expansion of the imprint template arrangement 20. In general terms, the interferometer 36 may be used to determine the position, rotation or degree of expansion or contraction of an imprint template arrangement, the imprint template arrangement being at least one of an imprint template, an imprint template holder, or an imprint template holder that is holding an imprint template.

The interferometers 32, 36 may be used to determine the position of the imprint template arrangement 20, the substrate holder 22 and/or the substrate 24. Such determination allows the imprint template arrangement 20 to be positioned relative to the substrate 24, or the substrate 24 to be positioned relative to the imprint template arrangement 20, or both. When the imprint template arrangement 20 and substrate 24 are in approximately the correct positions for imprinting to take place, accurate alignment of the imprint template arrangement 20 with a part of the substrate 24 on to which patterns are to be imprinted May be performed using one or more alignment markers 38 in conjunction with an alignment system 40, as is known in the art.

In order to be able to determine the position, rotation or degree of expansion of an imprint template arrangement using an interferometer arrangement, it is necessary for there to be an unobstructed path between the imprint template arrangement and the one or more interferometers forming the interferometer arrangement. Referring to FIG. 2, where only a single imprint template arrangement 20 is shown, it can be seen that there is an unobstructed path between each interferometer 36 used to determine the position, rotation or expansion of the imprint template arrangement 20, and the imprint template arrangement 20 itself. This means that it should be possible to determine the position, rotation and degree of expansion of the imprint template arrangement. However, when a plurality of imprint template arrangements are used, it may be difficult or impossible to be able to determine the position, rotation and degree of expansion of each of the imprint template arrangements. This difficulty is discussed in more detail in relation to FIG. 3.

Figure 3:
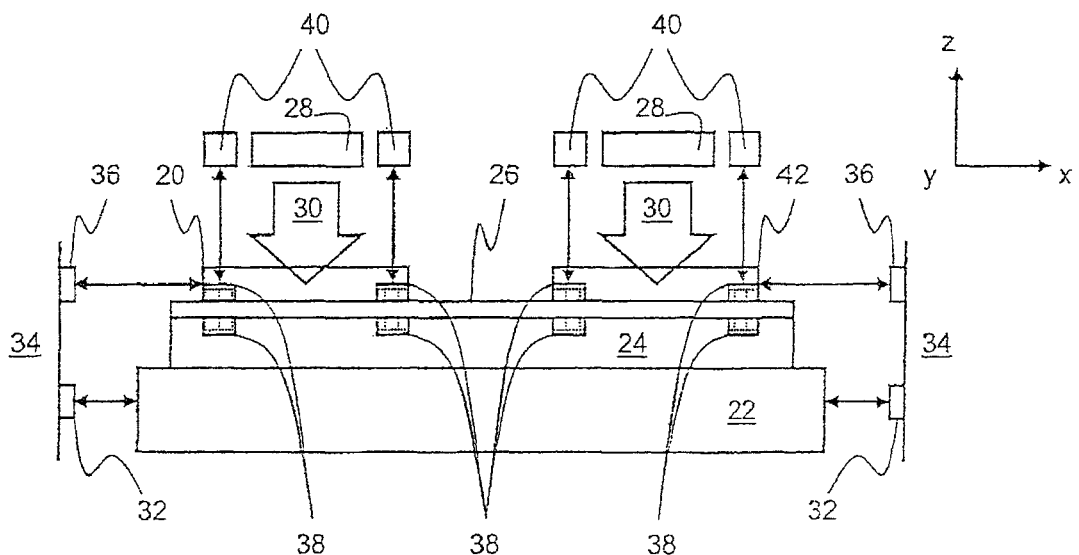
FIG. 3 schematically depicts an embodiment of an imprint apparatus.

FIG. 3 schematically depicts a similar imprint lithography apparatus to that shown in and described with reference to FIG. 2. Thus, features appearing in FIG. 3 that also appeared in FIG. 2 are given the same reference numerals. A difference between the imprint lithography apparatus of FIG. 3 and that of FIG. 2 is that in the imprint lithography apparatus shown in FIG. 3, a further (or second) imprint template arrangement 42 is provided. Thus, FIG. 3 shows a first imprint template arrangement 20, and a second imprint template arrangement 42.

Interferometers 36 for determining the position, rotation and degree of expansion of the imprint template arrangements 20, 42 are shown. Each interferometer 36 is able to determine the distance from that interferometer 36 to the imprint template arrangement 20, 42 immediately adjacent to that interferometer 36. This may allow, for example, the position of the imprint template arrangement 20, 42 to be determined, as well as possibly the degree of rotation of each imprint template arrangement 20, 42. This is particularly true if, as might be implemented in practice, further interferometers are used to determine the distance to each imprint template arrangement 20, 42 at different positions along one or more sides of the imprint template arrangements 20, 42.

Although the distance from an interferometer 36 to an adjacent imprint template arrangement 20, 42 can be determined, the distance can only be determined between the interferometer and a single, adjacent side of the imprint template arrangement 20, 42. Using the apparatus shown in FIG. 3, it is not possible to determine a distance from a given interferometer 36 to a different, opposite side of an imprint template arrangement 20, 42. Furthermore, the position of this opposite side of an imprint template arrangement 20, 42 cannot be determined using another interferometer 36. This is because the presence of two or more templates in line with one another (as shown in FIG. 3) prevents a beam of radiation from an interferometer reaching the opposite side of an imprint template arrangement 20, 42. Because a distance to opposite sides of the imprint template arrangement cannot be determined (i.e. the position of two opposite sides of the template cannot be measured) it is not possible to determine the degree of expansion (if any) of either of the imprint template arrangements 20, 42 shown in FIG. 3.

In imprint lithography, it is of significance to be able to determine the expansion of an imprint template arrangement, such that this expansion can be compensated for to help ensure that patterns are accurately and uniformly imprinted on to a substrate, and to help ensure that any overlay requirements may be met. It may therefore be desirable to provide an imprint lithography apparatus that is able to measure the degree of expansion of an imprint template arrangement.

In order to be able to accurately determine the position of one or more imprint template arrangements and/or substrates or substrate holders, or the degree of rotation or expansion (when a single imprint template arrangement is used) of those imprint template arrangements and/or substrates or substrate holders, the use of many interferometers may be required, as discussed above. Interferometers can be expensive, making the cost of the imprint lithographic apparatus expensive, and possibly too expensive to be commercially viable. It may therefore be desirable to provide an imprint lithography apparatus that does not use interferometers (or only interferometers) to determine the position, rotation or degree of expansion of an imprint template arrangement and/or a substrate or substrate holder.

In general, it is desirable to be able to obviate or mitigate one or more problems or disadvantages associated with the use of the arrangements of the apparatus shown in FIGS. 2 and/or 3.

According to an embodiment of the invention, there is provided an imprint lithography apparatus. The apparatus comprises, in an imprint template having a side provided with a patterned surface that can be used to imprint a pattern into an imprintable medium. An imprint template holder is provided and is configured to hold the imprint template. A substrate holder is provided and is configured to hold a substrate to be patterned by the imprint template. A structure (e.g. a plate or other structure, such a planar structure) is provided which is located away from the substrate holder, and which extends across the substrate holder (e.g. substantially parallel to the substrate holder). The structure is located such that the imprint template is, in use, located between the structure and the substrate holder. The structure is provided with a first part of a configuration determination arrangement, and the substrate or the substrate holder and the imprint template and/or imprint template holder is provided with a second part of the configuration determination arrangement. The configuration determined may be, for example, at least one selected from: a position, or a degree of rotation, or a degree of expansion (which may include contraction, i.e. negative expansion). The first part of the configuration determination arrangement or the second part of the configuration determination arrangement comprises one or more arrays of lines (e.g. an array of parallel lines, or two arrays of parallel lines orientated at 90° with respect to one another to form a grid). The other of the first part of the configuration determination arrangement and second part of the configuration determination arrangement comprises one or more encoders that face towards one or more of the one or more arrays of lines. The encoders can use the array of lines to determine relative movement between the array of lines and the encoders themselves. When the encoders are attached to an object, this allows the movement of the object relative to the array of lines to be determined. By determining the movement (i.e. change in position) at a number of locations around the object (e.g. the imprint template, the imprint template holder, or the substrate holder) it is possible to be able to determine not only a change in position of the object, but also the degree of rotation of that object, and with sufficient numbers of encoders, a degree of expansion of that object.

The configuration determination arrangement is configured to determine at least one of: a relative configuration between the substrate holder and the structure, a relative configuration between the imprint template or imprint template holder and the structure, and a relative configuration between the imprint template or imprint template holder and the substrate or substrate holder.

A specific embodiment of the invention will now be described, by way of example only, with reference to FIGS. 4 to 10.

Figure 4:
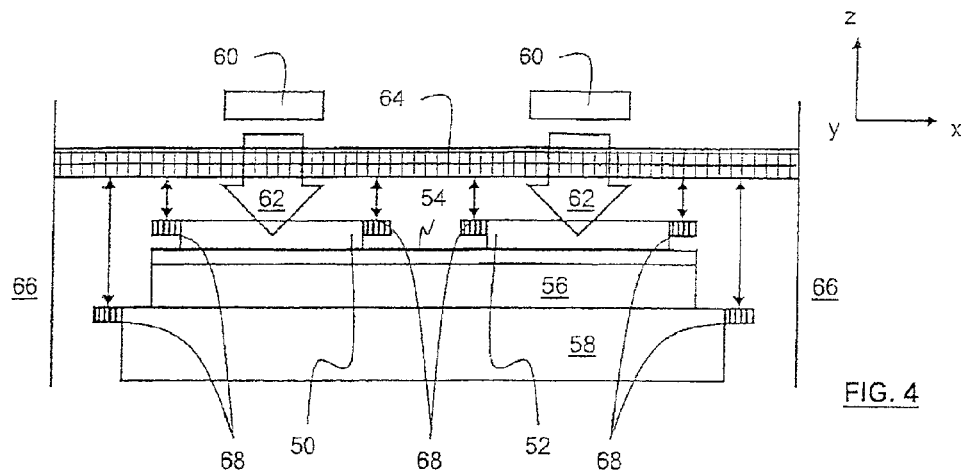
FIG. 4 schematically depicts an imprint apparatus according to an embodiment of the invention.

FIG. 4 schematically depicts an imprint apparatus according to an embodiment of the invention. The apparatus comprises a first imprint template arrangement 50 and a second imprint template arrangement 52. The imprint template arrangements 50, 52 may be imprinted into a layer of imprintable medium 54 provided on a substrate 56. The substrate 56 may be held in position by a substrate holder 58. One or more radiation sources 60 may be provided in order to provide radiation 62 (e.g. UV radiation). The radiation 62 may be used to freeze (i.e. fix) patterns that have been imprinted into the imprintable medium 54 by the imprint template arrangements 50, 52.

The imprint template arrangements 50, 52 may be imprint templates, imprint template holders, or imprint template holders that are (possibly only in use) each holding an imprint template.

In another embodiment (not shown), imprintable medium may only be located at locations on the substrate that are in-between the substrate and the imprint template arrangement or imprint template arrangements (i.e. the imprintable medium may not extend across the entire substrate).

A structure 64 in the form of a plate is shown as being located away from the substrate holder 58 and substrate 56, and extending across the substrate holder 58 and substrate 56. The structure 64 extends substantially parallel to the substrate 56 and substrate holder 58. The structure 64 may be supported by a support frame 66 or the like which at least partially surrounds the substrate holder 58, substrate 56 and imprint template arrangements 50, 52. Alternatively, the structure may be supported (or held) by a support or the like which is located above the structure. The structure may be located such that the imprint template arrangements 50, 52 are located between the structure 64 and the substrate 56 and substrate holder 58. Movement or deformation (e.g. expansion or contraction) of the imprint template arrangements 50, 52 may be undertaken by using one or more actuators (not shown) which may be at least partially located between the structure 64, and the substrate 56 and substrate holder 58.

The structure 64 should be substantially transparent to radiation that is required to freeze or fix a pattern provided in the imprintable medium 54 by the imprint template arrangements 50, 52. For instance, the structure 64 may be substantially transparent to UV radiation. The structure 64 may alternatively or additionally be transparent to radiation used, for example, by an additional alignment system. In other embodiments, radiation used in alignment, or fixing of the imprinted pattern, may not need to pass through the structure. For example, such radiation may be directed in an appropriate manner using mirrors or optical fibers or the like.

The structure 64 is provided with a first part of a configuration determination arrangement, and the substrate holder 58 and imprint template arrangements 50, 52 are each provided with a second part of a configuration determination arrangement. In this embodiment, the configuration determination arrangement is an encoder arrangement. The encoder arrangement comprises one or more encoders 68 which form the second part of the configuration determination arrangement with which the substrate holder 58 and imprint template arrangements 50, 52 are provided. The structure 64 is provided with a two-dimensional array of lines (i.e. a grid), which forms the first part of the configuration determination arrangement.

The encoders 68 face towards the structure 64 provided with the two dimensional array of lines. There is no obstruction between each encoder 68 and the structure 64. Thus, if a sufficient number, of encoders 68 are used, the position, degree of rotation and/or degree of expansion or contraction of the substrate holder 58 and each imprint template arrangement 50, 52 can be determined.

If a sufficiently large number of encoders are used, an obstruction May be present between some of the encoders and the structure, yet the position, degree of rotation and degree of expansion or contraction of the substrate holder and each imprint template arrangement can be determined using other encoders (i.e. the system may have some degree of redundancy).

The substrate 56, substrate holder 58 and imprint template arrangements 50, 52 are movable relative to the structure 64. The structure 64 thus provides a fixed reference against which the relative change in position, rotation or expansion (or contraction) of the substrate holder 58 and/or imprint template arrangement 50, 52 can be determined and measured. The fixed reference provided by the structure 64 allows the position, rotation and/or expansion (or contraction) of the substrate holder 58 (or the substrate 56 held by the substrate holder 58) to be determined relative to the imprint template arrangements 50, 52. A change in position, degree of rotation, or degree of expansion, can be determined by measuring the relative movement of one or more of the encoders.

FIG. 4 shows that the structure 64 may be provided with a single (two-dimensional) array of lines that extends across substantially the entirety of the structure 64. Such an arrangement would not be possible in optical lithography, because the array of lines would likely affect the pattern imparted into a patterned beam of radiation projected onto a substrate, and this would adversely affect the pattern features provided on that substrate. This, however, is not a problem in imprint lithography, since a patterned beam of radiation is not projected on to a substrate. Instead, a particular dose of radiation is required in order to freeze or fix a pattern imprinted into imprintable medium by an imprint template arrangement. Furthermore, the structure 64 may extend across the substrate 56 and substrate holder 58 in a continuous manner. The structure may be free of apertures. Again, in optical lithography this may not be possible. The structure 64 might adversely affect the transmission of the patterned radiation beam projected onto a substrate, adversely affecting pattern features provided on that substrate. Thus, in optical lithography, it may be necessary to provide apertures in a structure similar to that shown and described with reference to FIG. 4. This, however, is not a problem in imprint lithography, since a patterned beam of radiation is not projected on to a substrate. Instead, a particular dose of radiation is required in order to freeze or fix a pattern imprinted into imprintable medium by an imprint template arrangement.

The structure 64 and its implementation described herein are particularly suited to imprint lithography. This is because the structure 64 can be relatively simple in that it can be a plate-like structure provided with one or more arrays of lines that, in one example, may extend across substantially half or more of the structure. No accurately constructed or complex apertures need to be provided in the structure, and there is also no need for regions of the structure that do not have grid lines. A structure for use in imprint lithography may therefore be relatively easy to manufacture and use in comparison with a similar structure for use in optical lithography (if, in fact such a structure could be made). This ease of manufacture may have cost benefits.

As discussed above, it is desirable to be able to determine the position, degree of rotation and/or degree of expansion (or contraction) of an imprint template arrangement. Thus, it is desirable to ensure that the first part of the configuration determination arrangement comprises a number and/or arrangement of array of lines, and the second part of the determination configuration arrangement comprises a number and/or arrangement of encoders, that is together sufficient to be able to determine the relative configuration between the imprint template arrangement and the structure in four degrees of freedom. The four degrees of freedom are: translation in a first direction (e.g. the x-direction in the Figures) and translation in a second direction (e.g. the y-direction in the Figures) in order to be able to determine the relative positions of the imprint template arrangement and the structure, and also the rotation, and degree of expansion or contraction (for example in first and second (possibly perpendicular directions—i.e. x and y directions). This may be achieved by ensuring that the array of lines provided on the structure comprises lines that extend in a first direction and lines that extend in a second direction (e.g. the first direction being perpendicular to the second direction, to form a grid), and wherein the encoders comprise at least four encoders, at least two of the at least four encoders each being configured to determine movement in a direction relative to the first direction, and at least two others of the at least four encoders each being configured to determine movement in a direction relative to the second direction, the at least four encoders being located around the imprint template arrangement. Alternatively, the encoders may comprise at least two encoders, each of at least two encoders being configured to determine movement in a direction relative to the first direction and a direction relative to the second direction, the encoders being located around the imprint template arrangement. The direction relative to the first direction may be substantially perpendicular to the first direction, and the direction relative to the second direction may be substantially perpendicular to the second direction.

The number and/or arrangement of encoders and the number and/or arrangement of array of lines may also be sufficient to be able to determine the relative configuration between the imprint template arrangement and the structure in a further degree of freedom, for example in a third direction (e.g. the z-direction in the Figures) that is perpendicular to the first and second directions. This may be achieved by the configuration of lines and encoders described above. For example, movement of the encoder toward or away from an array of lines (i.e. in a third direction, such as the z-direction in the Figures) is detectable using the encoders that are configured to determine movement in the first and second directions (e.g. in the x and y-directions in the Figures). Alternatively or additionally, expansion of a more non-uniform nature may be determined (e.g. expansion in a pin-cushion manner, parallelogram manner, or the like).

Figures 5A, 5B, 5C:
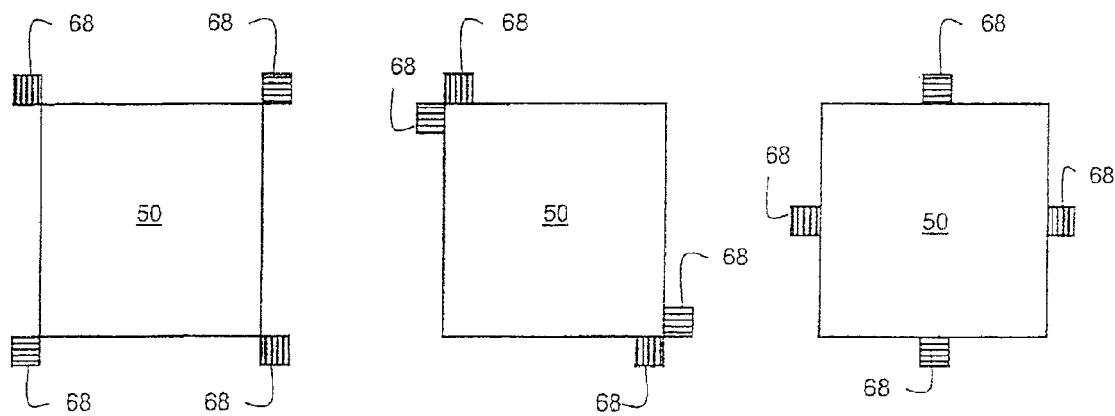
FIGS. 5a to 5e schematically depict various different encoder locations and configurations relative to an imprint template arrangement.

FIGS. 5a to 5e schematically depict examples of various numbers and configurations for the encoders 68. FIG. 5a schematically depicts a plan view of an imprint template arrangement 50. Located at each corner of the imprint template arrangement 50 is an encoder 68. There are at least four encoders 68 in total. At least two of the four encoders are arranged to determine relative movement of the imprint template arrangement 50 in the y-direction. At least two others of the at least four encoders 68 are configured to determine relative movement of the imprint template arrangement 50 in the x-direction (shown by the differing orientation of the line gratings). Such a movement may be determined by the encoders 68 being provided with a feature that facilitates detection of movement in a certain direction, for example lines or detection elements arranged in a certain orientation, for example parallel or perpendicular (or some other angle relative) to the y or x-directions.

FIGS. 5b and 5c show that encoders 68 do not need to be located at each corner of the imprint template arrangement 50. Instead, as shown in FIG. 5b, at least two of at least four encoders 68 can be located at one corner of the imprint template arrangement 50, and at least two others located at another corner of the imprint template arrangement 50. Alternatively, and as shown in FIG. 5c, the encoders 68 can be located along one or more sides of the imprint template arrangement 50.

Those encoders 68 that are configured to detect movement in a same direction (e.g. the x-direction, or the y-direction) should ideally be located remote from one another to ensure that more accurate measurement can be undertaken. If such encoders were located adjacent to one another, the resolution of any measurement may be reduced. It is desirable that encoders for measuring movement in the same direction are offset from one another in the x and y-directions, to ensure that measurements are as accurate and useful as possible. For instance, if the encoders have the same x or y position on the imprint template arrangement, the encoders may determine the same movement in the x or y direction which may not provide much or any useful information. However, if the x or y positions of the encoders are offset, more useful information may be obtained.

Figures 5D, 5E:
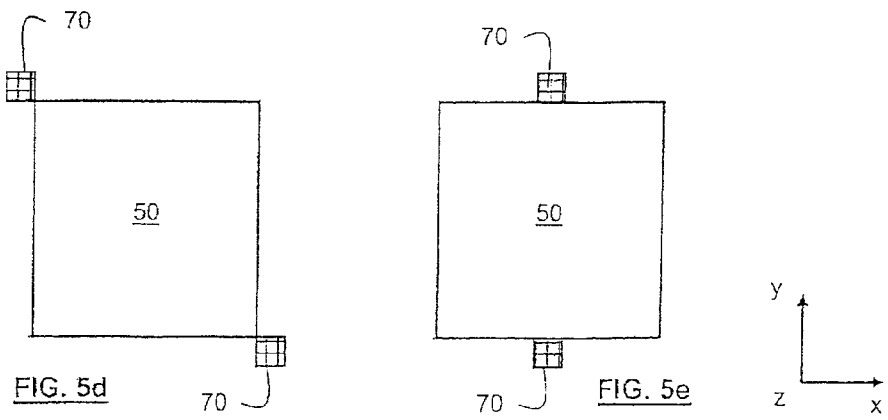

Instead of providing four encoders, each of which can detect movement in a single direction, it is possible to provide encoders that are configured to determine movement in one or two directions. This may be achieved, for example, by providing encoders that have features that allow the detection of movement in one or two directions. For instance, these encoders may be provided with arrays of lines or detection elements that extend in a particular direction, for example parallel or perpendicular (or some other angle relative) to the y or x-directions. FIG. 5d shows that two such encoders 70 may be provided at opposite corners of the imprint template arrangement 50. FIG. 5e shows that the encoders 70 may be provided on opposite sides of the imprint template arrangement 50. It is desirable that the position of each encoder is offset in the x and y-directions to ensure that measurements are as accurate and useful as possible. For instance, if the encoders have the same x or y position on the imprint template arrangement, the encoders may determine the same movement in the x or y direction which may not provide much or any useful information. However, if the x or y positions of the encoders are offset, more useful information may be obtained.

It will be appreciated that in other embodiments, the encoders may be located in any suitable manner. For example, the encoders may be located in one or more combinations or part-combinations of the locations shown in FIGS. 5a to 5e. The locations may not be symmetric. This may be taken advantage of if, for example, the imprint template arrangement is not symmetric, or if the structure of or attachments to the imprint template arrangement prevent encoders being located in a symmetric manner. For instance, one encoder could be located halfway along a side of the imprint template arrangement, and another encoder could be located adjacent to or at a corner of the imprint template arrangement.

Figure 6A:
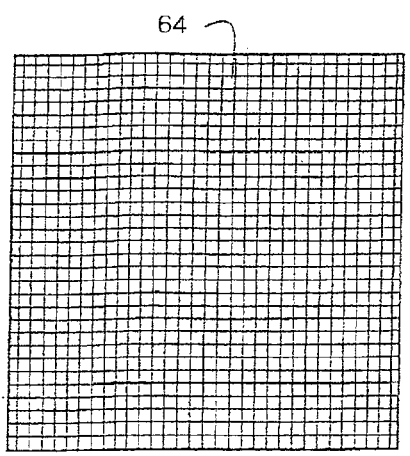
FIGS. 6a and 6b schematically depict, respectively, an array of lines in a form of a grid having a first orientation, and an encoder configuration for use with that grid.
Figure 6B:
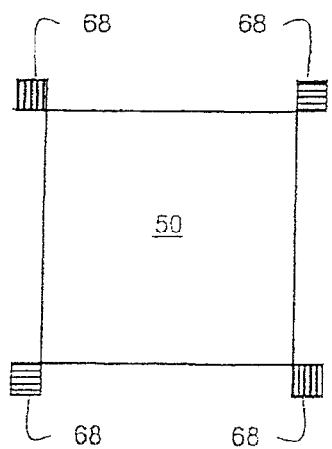
Figure 7A:
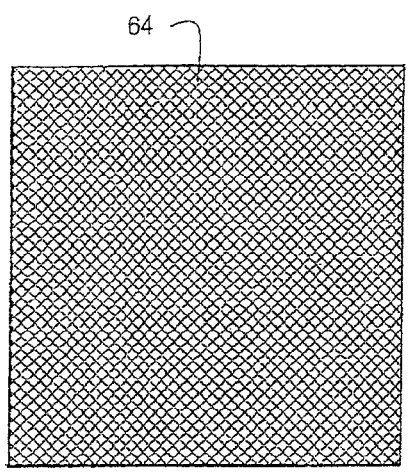
FIGS. 7a and 7b schematically depict, respectively, an array of lines in a form of a grid having a second orientation, and an encoder configuration for use with that grid.
Figure 7B:
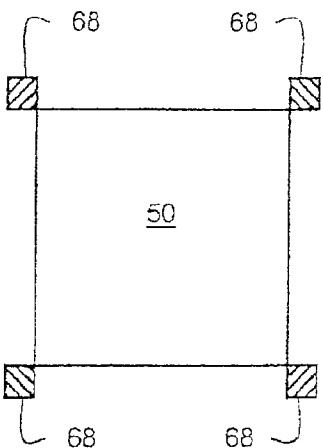

FIG. 6a shows that a two-dimensional array (e.g. grid) of lines with which the structure 64 is provided may extend in the x and y-directions. FIG. 6b shows that in order to detect movement between the structure 64 and the imprint template arrangement 50, the encoders 68 should be able to detect movement in the x and/or y-directions, which may be facilitated by providing encoders 68 which have detection features or elements which also extend in the x and/or y-directions. In an alternative arrangement, FIG. 7a shows that the two-dimensional array (e.g. grid) of lines with which the structure 64 is provided may extend at 45° with respect to the x and y-directions. FIG. 7b shows that in order to be able to detect movement between such an array of lines and the imprint template arrangement 50, the encoders 68 may be provided with detection elements or features that also extend at 45° with respect to the x and y-directions.

As discussed above, expansion of an imprint template needs to be taken into account in order to ensure that pattern features are accurately applied to a substrate. In practice, it is more likely and more common for an imprint template to expand at a much greater rate than a substrate holder. Thus, it may not be necessary to determine the degree of expansion of the substrate holder. Therefore, the first part of the determination configuration arrangement may comprise a number and/or arrangement of array of lines, and the second part of the configuration determination arrangement may comprise a number and/or arrangement of encoders that is together sufficient to be able to determine the relative configuration between the substrate holder and the structure in only three degrees (i.e. not four degrees) of freedom. The three degrees of freedom may be translation in a first direction, translation in a second direction, and rotation (i.e. not expansion).

The number and/or arrangement of encoders and the number and/or arrangement of array of lines May also be sufficient to be able to determine the relative configuration between the substrate and the structure in a further degree of freedom, for example in a third direction (e.g. the z-direction in the Figures) that is perpendicular to the first and second directions. This may also be achieved by the configuration of line's and encoders described above. For example, movement of the encoder toward or away from an array of lines (i.e. in a third direction, such as the z-direction in the Figures) is detectable using the encoders that are configured to determine movement in the first and second directions (e.g. in the x and y-directions in the Figures).

Figure 8:
FIG. 8 schematically depicts an imprint apparatus according to an embodiment of the invention.
Figure 8:
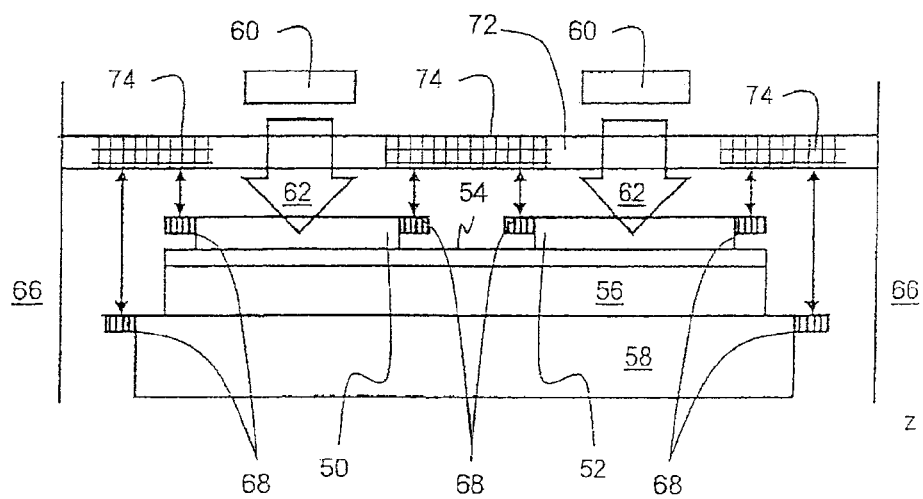

FIG. 8 schematically depicts a further embodiment of the invention. The imprint lithography apparatus of FIG. 8 is similar to the imprint lithography apparatus shown in and described with reference to FIG. 4, and therefore like features appearing in both Figures are given the same reference numerals. In contrast to FIG. 4, however, the structure 72 in FIG. 8 (akin to structure 64 in FIG. 4) is not provided with an array of lines that extend substantially across the entirety of the structure 72. Instead, the structure 72 is provided with a plurality of arrays of lines 74, each array of the plurality being located at different positions on the structure 72. The positions of the arrays of lines 74 may be selected to coincide substantially with the positions of encoders 68 that face those arrays of lines 74. The arrays of lines 74 are provided on a fixed structure 72 and thus still provide the fixed point of reference described above. By providing arrays of lines located at different positions on the structure 72, part of the structure 72 will not be provided with lines. The parts of the structure 72 not provided with lines may permit more radiation to pass through the structure 72 to, for example, fix patterns provided in the imprintable medium by imprint template arrangements 50, 52. This may mean that the output of radiation sources 60 needs to be lower, thereby saving energy and money or reducing the amount of stray radiation in the system.

Alternatively or additionally, since the structure 72 is not provided with an array of lines that extend substantially across the entirety of the structure 72 (i.e. fewer lines are provide in comparison with the structure of FIG. 4), the structure 72 may be cheaper to manufacture or maintain.

Figure 9:
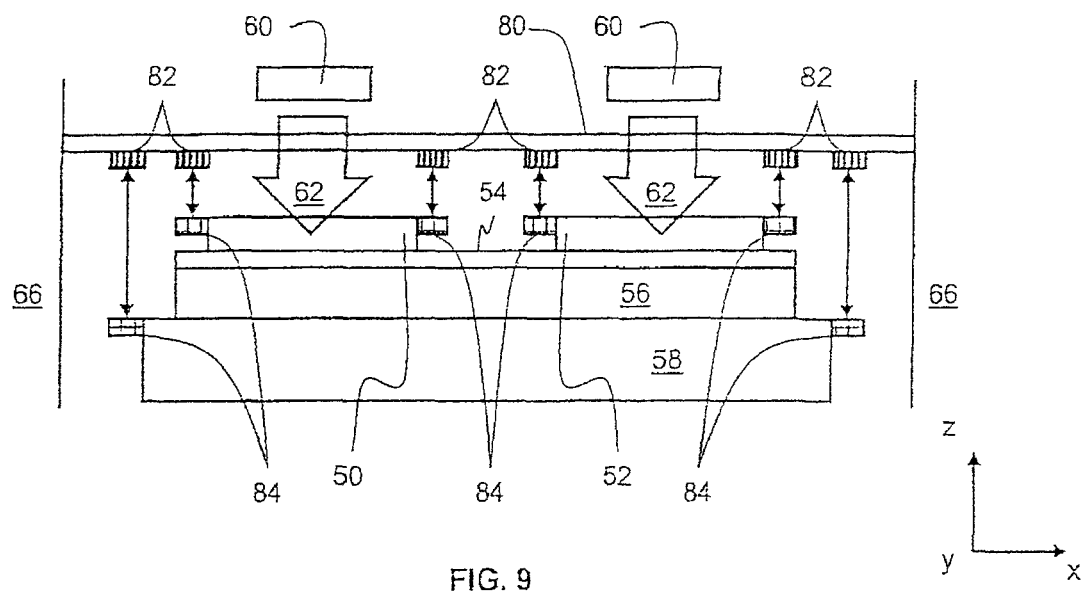
FIG. 9 schematically depicts an imprint apparatus according to an embodiment of the invention.

In the embodiments shown in and described with reference to FIGS. 4 to 8, the first part of the configuration determination arrangement with which the structure is provided is described as comprising one or more arrays of lines. A second part of the configuration determination arrangement with which the substrate holder and imprint template arrangement is provided is described as comprising one or more encoders that face towards one or more of the one or more arrays of lines. In an alternative arrangement, the second part of the configuration determination arrangement may comprise one or more arrays of lines, and the first part of the configuration determination arrangement may comprise one or more encoders facing towards one or more of the one or more arrays of lines. A structure may be provided with the one or more encoders, and the substrate holder and imprint template arrangement provided with the one or more arrays of lines. FIG. 9 schematically depicts such an imprint lithography apparatus.

The imprint lithography apparatus shown in FIG. 9 is similar to that shown in FIG. 4, and thus like features appearing in FIGS. 4 and 9 are given the same reference numerals. In contrast to FIG. 4, in the apparatus of FIG. 9 the structure 80 (akin to structure 64 of FIG. 4) is provided with encoders 82. The encoders 82 face towards arrays of lines 84 that are provided on, or on structures attached to, the imprint template arrangements 50, 52 and substrate holder 58. With the exception of this structural difference, the operation of the imprint lithography apparatus is substantially the same as that shown in and described with reference to FIGS. 4 to 8.

Figure 10:
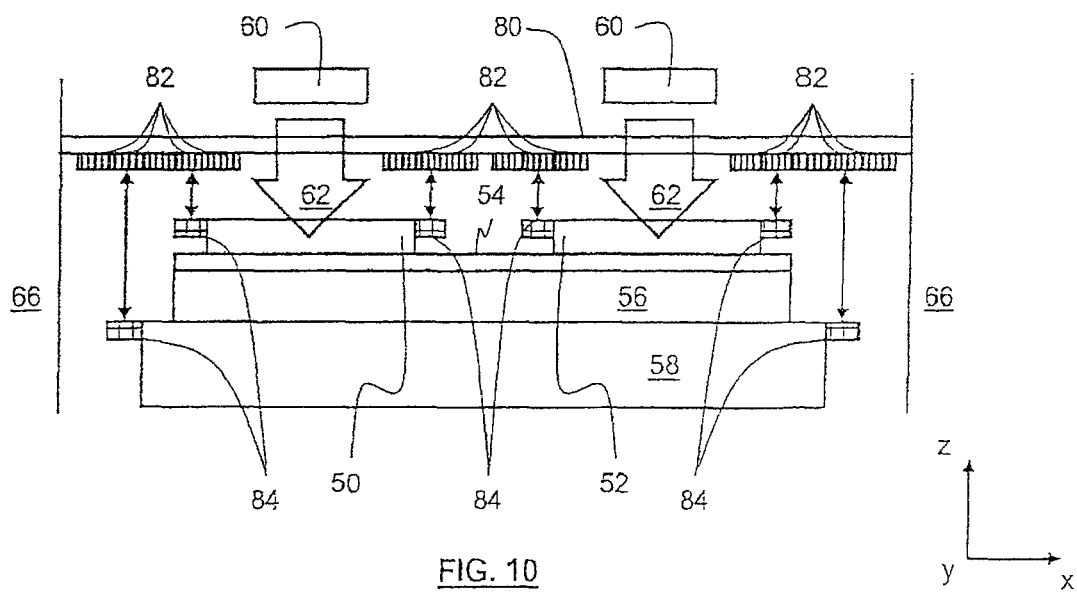
FIG. 10 schematically depicts an imprint apparatus according to an embodiment of the invention.

The imprint lithography apparatus of FIG. 4 does, however, have at least one advantage over the imprint lithography apparatus shown in FIG. 9. This advantage can be understood by describing a disadvantage associated with the apparatus of FIG. 9. If, in FIG. 9, the substrate table 58 or imprint template arrangements 50, 52 are moved to such an extent that the encoders 82 no longer face the grid lines 84 provided on the substrate holder 58 or imprint template arrangements 50, 52, the position of the substrate holder 58, or imprint template arrangements 50, 52 can no longer be determined. This problem can only be overcome by extending the detection area of the encoders 82, and/or by providing more encoders 82, and/or by providing a larger area or number of areas of arrays of lines. An embodiment is schematically depicted in FIG. 10. FIG. 10 schematically depicts the same arrangement as shown in FIG. 9, only with a greater number of encoders 82 facing the approximate position of the arrays of lines 84 in order to avoid the problem of the movement of the arrays of lines 84 being outside the physical detection range of the encoders 82. Referring back to FIG. 4, it will be appreciated that the imprint lithography apparatus described therein does not have this problem. This is because the encoders 68 will always face towards the array of lines provided by the structure 64, because the array of lines provided by the structure 64 extends all the way across the imprint templates 50, 52, substrate 56 and substrate holder 58. Thus, the imprint lithography apparatus of FIG. 4 may be a more practical implementation than that of FIG. 9 or FIG. 10. Furthermore, since it is likely that the encoders of an encoder arrangement are more expensive that the provision of grid lines, the imprint lithography apparatus of FIG. 9 and FIG. 4 may also be less expensive that the imprint lithography apparatus shown in FIG. 10.

Further embodiments of the invention will now be described.

In one such further embodiment, the imprint template arrangement may be fixed in position, and not be moveable. An array of lines (e.g. on a structure as described above) may form part of or be attached to the imprint template arrangement. Alternatively, one or more encoders may be attached to or form part of the imprint template arrangement. The imprint template arrangement provides a fixed and absolute reference point.

In an further embodiment, the substrate holder may be fixed in position, and not be moveable. An array of lines (e.g. on a structure as described above) may form part of or be attached to the substrate holder. Alternatively, one or more encoders may be attached to or form part of the substrate holder. The substrate holder provides a fixed and absolute reference point.

In a further embodiment, both the imprint template arrangement and substrate holder may be moveable. The imprint template arrangement may be provided with an array of lines (e.g. on a structure as described above) or the encoders, and the substrate holder may be provided with the corresponding encoders or an array of lines (e.g. on a structure as described above). This arrangement allows information about the relative movement between the imprint template arrangement and the substrate holder to be determined. An absolute measurement of position may be obtained by an interferometer or a further encoder system (e.g. which is at least partially attached to a fixed frame or the like which is fixed relative to the moveable imprint template arrangement and substrate holder).

In the above embodiments of the invention, multiple imprint templates have been described. An embodiment of the invention is also applicable to the use of a single imprint template arrangement.

In some embodiments, the structure may be the lines or arrays of lines, and not a body provided with those lines. In some embodiments, the structure may be the imprint template arrangement or the substrate holder, for example a surface of the imprint template arrangement or the substrate holder.

In the above embodiments, the encoders and arrays of lines have together been described as being used to determine a relative configuration (e.g. position or orientation) between a substrate holder and an imprint template arrangement, or the like. In practice, this is achieved by determined relative configurations between different points or locations of the imprint template arrangement and the substrate holder.

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

The invention claimed is:

1. An imprint lithography apparatus, comprising:
    an imprint template arrangement for use in imprinting a pattern into imprintable medium;
    a substrate holder configured to hold a substrate provided with imprintable medium to, in use, be patterned by the imprint template arrangement;
    a structure located away from the substrate holder and extending across the substrate holder, and such that the imprint template arrangement is, in use, located between the structure and the substrate holder, wherein:
    the substrate or substrate holder has a first part of a substrate or substrate holder configuration determination arrangement and the structure has a second part of the substrate or substrate holder configuration determination arrangement, the first part or second part of the substrate or substrate holder configuration determination arrangement comprising one or more arrays of lines whose displacement is being measured, and the other of the first part or second part of the substrate or substrate holder configuration determination arrangement comprising one or more encoders that faces towards, and arranged to measure the displacement of, one or more of the one or more arrays of lines, and
    the imprint template arrangement has a first part of an imprint template arrangement configuration determination arrangement and the structure has a second part of the imprint template arrangement configuration determination arrangement, the first part or second part of the imprint template arrangement configuration determination arrangement comprising one or more arrays of lines whose displacement is being measured, and the other of the first part or second part of the imprint template arrangement configuration determination comprising one or more encoders that faces towards one or more of the one or more arrays of lines and arranged to measure the displacement of the one or more of the one or more arrays of lines separately from the displacement measured by the substrate or substrate holder configuration determination arrangement of the one or more of the one or more arrays of lines of the substrate or substrate holder configuration determination arrangement.

2. The apparatus of claim 1, wherein a single array of lines is provided, the single array of lines extending across substantially half or more of the structure.

3. The apparatus of claim 1, wherein a plurality of arrays of lines are provided, each array of the plurality located at a different position on the structure.

4. The apparatus of claim 1, wherein the structure extends across the substrate in a continuous manner, such that the structure is free of apertures.

5. The apparatus of claim 1, wherein the first part of the substrate or substrate holder configuration determination arrangement or of the imprint template arrangement configuration determination arrangement, comprises the one or more arrays of lines, and the second part of the substrate or substrate holder configuration determination arrangement or of the imprint template arrangement configuration determination arrangement, comprises the one or more encoders that face towards one or more of the one or more arrays of lines.

6. The apparatus of claim 1, wherein the second part of the substrate or substrate holder configuration determination arrangement or of the imprint template arrangement configuration determination arrangement, comprises the one or more arrays of lines, and the first part of the substrate or substrate holder configuration determination arrangement or of the imprint template arrangement configuration determination arrangement, comprises the one or more encoders that face towards one or more of the one or more arrays of lines.

7. The apparatus of claim 1, wherein the number and/or arrangement of arrays of lines, and the number and/or arrangement of encoders, is together sufficient to be able to determine the relative configuration in three or four degrees of freedom, the three or four degrees of freedom being three or four selected from:
translation in a first direction; or
translation in a second direction; or
rotation; or
expansion or contraction.

8. The apparatus of claim 7, wherein:
the one or more arrays of lines comprise lines extending in a first direction and lines extending in a second direction, and
the one or more encoders comprise:
at least four encoders, at least two of the at least four encoders each configured to determine movement in a direction relative to the first direction, and at least two others of the at least four encoders each configured to determine movement in a direction relative to the second direction,
or
at least three or four encoders, one of the three or four encoders configured to determine movement in a direction relative to the first direction, and at least one of the other encoders configured to determine movement in a direction relative to the second direction,
or
at least two encoders, each of at least two encoders configured to determine movement in a direction relative to the first direction and a direction relative to the second direction.

9. The apparatus of claim 7, wherein the first direction is substantially perpendicular to the second direction.

10. The apparatus of claim 1, comprising a plurality of imprint template arrangements, each imprint template arrangement having a first part of the imprint template arrangement configuration determination arrangement.

11. The apparatus of claim 1, wherein the substrate or substrate holder configuration determination arrangement and/or the imprint template arrangement configuration determination arrangement is configured to determine at least one selected from: a relative configuration between the substrate or substrate holder and the structure, or a relative configuration between the imprint template arrangement and the structure, or a relative configuration between the imprint template arrangement and the substrate or substrate holder.

12. The apparatus of claim 11, wherein the relative configuration is one or more selected from: a relative translational position, or a relative rotational position, or a relative degree of expansion.

13. The apparatus of claim 1, wherein the structure is located apart from the imprint template arrangement.

14. The apparatus of claim 1, wherein the substrate or substrate holder configuration determination arrangement and the imprint template arrangement configuration determination arrangement share the same second part.

15. An imprint lithography apparatus, comprising:
an imprint template arrangement for use in imprinting a pattern into imprintable medium;
a substrate holder configured to hold a substrate provided with imprintable medium to, in use, be patterned by the imprint template arrangement;
a structure located above and apart from the imprint template arrangement and the substrate holder, and such that the imprint template arrangement is, in use, located between the structure and the substrate holder, wherein:
the substrate or substrate holder has a first part of a substrate or substrate holder configuration determination arrangement and the structure has a second part of the substrate or substrate holder configuration determination arrangement, the first part or second part of the substrate or substrate holder configuration determination arrangement comprising one or more arrays of lines whose displacement is being measured, and the other of the first part or second part of the substrate or substrate holder configuration determination arrangement comprising one or more encoders that faces towards, and arranged to measure the displacement of, one or more of the one or more arrays of lines, and
the imprint template arrangement has a first part of an imprint template arrangement configuration determination arrangement and the structure has a second part of the imprint template arrangement configuration determination arrangement, the first part or second part of the imprint template arrangement configuration determination arrangement comprising one or more arrays of lines whose displacement is being measured, and the other of the first part or second part of the imprint template arrangement configuration determination comprising one or more encoders that faces towards one or more of the one or more arrays of lines and arranged to measure the displacement of the one or more of the one or more arrays of lines separately from the displacement measured by the substrate or substrate holder configuration determination arrangement of the one or more of the one or more arrays of lines of the substrate or substrate holder configuration determination arrangement.

16. A device manufacturing method, comprising:
holding a substrate provided with imprintable medium using a substrate holder of an imprint lithography apparatus;
imprinting a pattern into the imprintable medium using an imprint template arrangement of an imprint lithography apparatus; and
determining, using a substrate or substrate holder configuration determination arrangement and/or an imprint template arrangement configuration determination arrangement, at least one selected from: a relative configuration between the substrate or substrate holder and the structure, or a relative configuration between the imprint template arrangement and the structure, or a relative configuration between the imprint template arrangement and the substrate or substrate holder, wherein:
a structure is located away from the substrate holder and extends across the substrate holder, and such that the imprint template arrangement is, in use, located between the structure and the substrate holder,
the substrate or substrate holder has a first part of the substrate or substrate holder configuration determination arrangement and the structure has a second part of the substrate or substrate holder configuration determination arrangement, the first part or second part of the substrate or substrate holder configuration determination arrangement comprising one or more arrays of lines whose displacement is being measured, and the other of the first part or second part of the substrate or substrate holder configuration determination arrangement comprising one or more encoders that faces towards, and arranged to measure the displacement of, one or more of the one or more arrays of lines, and the imprint template arrangement has a first part of an imprint template arrangement configuration determination arrangement and the structure has a second part of the imprint template arrangement configuration determination arrangement, the first part or second part of the imprint template arrangement configuration determination arrangement comprising one or more arrays of lines whose displacement is being measured, and the other of the first part or second part of the imprint template arrangement configuration determination comprising one or more encoders that faces towards one or more of the one or more arrays of lines and arranged to measure the displacement of the one or more of the one or more arrays of lines separately from the displacement measured by the substrate or substrate holder configuration determination arrangement of the one or more of the one or more arrays of lines of the substrate or substrate holder configuration determination arrangement.

17. The method of claim 16, wherein a single array of lines is provided, the single array of lines extending across substantially half or more of the structure.

18. The method of claim 16, wherein the structure extends across the substrate in a continuous manner, such that the structure is free of apertures.

19. The method of claim 16, wherein the structure is located apart from the imprint template arrangement.

20. A device manufacturing method, comprising:
holding a substrate provided with imprintable medium using a substrate holder of an imprint lithography apparatus;
imprinting a pattern into the imprintable medium using an imprint template arrangement of an imprint lithography apparatus; and
determining, using a substrate or substrate holder configuration determination arrangement and/or an imprint template arrangement configuration determination arrangement, at least one selected from: a relative configuration between the substrate or substrate holder and the structure, or a relative configuration between the imprint template arrangement and the structure, or a relative configuration between the imprint template arrangement and the substrate or substrate holder, wherein:

a structure is located above and apart from the imprint template arrangement and the substrate holder, and such that the imprint template arrangement is, in use, located between the structure and the substrate holder, the substrate or substrate holder has a first part of the substrate or substrate holder configuration determination arrangement and the structure has a second part of the substrate or substrate holder configuration determination arrangement, the first part or second part of the substrate or substrate holder configuration determination arrangement comprising one or more arrays of lines whose displacement is being measured, and the other of the first part or second part of the substrate or substrate holder configuration determination arrangement comprising one or more encoders that faces towards, and arranged to measure the displacement of, one or more of the one or more arrays of lines, and the imprint template arrangement has a first part of an imprint template arrangement configuration determination arrangement and the structure has a second part of the imprint template arrangement configuration determination arrangement, the first part or second part of the imprint template arrangement configuration determination arrangement comprising one or more arrays of lines whose displacement is being measured, and the other of the first part or second part of the imprint template arrangement configuration determination comprising one or more encoders that faces towards one or more of the one or more arrays of lines and arranged to measure the displacement of the one or more of the one or more arrays of lines separately from the displacement measured by the substrate or substrate holder configuration determination arrangement of the one or more of the one or more arrays of lines of the substrate or substrate holder configuration determination arrangement.

* * * * *

UNITED STATES PATENT AND TRADEMARK OFFICE
CERTIFICATE OF CORRECTION

PATENT NO. : 9,116,423 B2  
APPLICATION NO. : 12/821806  
DATED : August 25, 2015  
INVENTOR(S) : Andre Bernardus Jeunink et al.

Page 1 of 1

It is certified that error appears in the above-identified patent and that said Letters Patent is hereby corrected as shown below:

On Title Page, Item (75) Inventors, Line 1  
        replace "Bergeik"  
        with --Bergeijk--.

Signed and Sealed this  
Sixteenth Day of February, 2016

Michelle K. Lee  
*Director of the United States Patent and Trademark Office*